United States Patent [19]
Gaudet et al.

[11] Patent Number: 6,154,083
[45] Date of Patent: *Nov. 28, 2000

[54] GROUND BOUNCE CONTROL USING DLL TO OPTIMIZE OUTPUT STAGE DI/DT USING OUTPUT DRIVER REPLICA

[75] Inventors: Brian Gaudet; Kristen Luttinger, both of San Jose, Calif.

[73] Assignee: National Semiconductor Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 09/080,445

[22] Filed: May 18, 1998

[51] Int. Cl.⁷ ........................................... H03K 5/08
[52] U.S. Cl. ..................... 327/312; 327/161; 327/387; 326/27
[58] Field of Search ................. 327/108–117, 161, 327/170, 134, 310, 312, 313, 427, 379–382, 384, 387, 389, 391, 261, 264; 326/21, 26, 27, 82, 83, 85

[56] References Cited

U.S. PATENT DOCUMENTS

| | | | |
|---|---|---|---|
| 5,336,940 | 8/1994 | Sorrells et al. | 327/276 |
| 5,497,105 | 3/1996 | Oh et al. | 326/27 |
| 5,719,514 | 2/1998 | Sato | 327/262 |
| 5,768,177 | 6/1998 | Sakuragi | 365/194 |

OTHER PUBLICATIONS

C.S. Choy, M.H. Ku and C.F. Chan, "A Low Power–Noise Output Driver with an Adaptive Characteristic Applicalbe to a Wide Range of Loading Conditions", IEEE Journal of Solid State Circuits, vol. 32, No. 6, Jun. 1997, pp. 913–917.

Primary Examiner—Timothy P. Callahan
Assistant Examiner—Minh Nguyen
Attorney, Agent, or Firm—Limbach & Limbach LLP

[57] ABSTRACT

A circuit for reducing the ground and power supply bounce of the output drivers in a group of I/O cells. A replica I/O cell is part of a delay locked loop which uses closed-loop feedback control to determine the magnitude of a bias current needed to cause the delay through the replica cell to be equal to a reference value. By forcing the delay through the replica cell to be equal to a desired reference value, the magnitude of bias current required to control the delay through each of the I/O cells in an I/O ring so that the delay approaches the reference value can be determined. As a result, by properly selecting the reference delay value, the magnitude of the bias current required to compensate for delay variations arising from multiple sources (e.g., PVT) can be determined. Since this reduces the rate of change of the current in the output drivers of the actual I/O cells, the induced voltage responsible for the ground and/or power supply bounce in those cells is reduced.

2 Claims, 11 Drawing Sheets

GROUND BOUNCE CONTROL USING DLL TO OPTIMIZE OUTPUT STAGE DI/DT USING OUTPUT DRIVER REPLICA

TECHNICAL FIELD

The present invention is directed to the operation of integrated circuit output drivers used to drive off chip loads, and more specifically, to a circuit for reducing the voltage change on a ground pin arising from a changing current in the output driver, thereby reducing ground bounce.

BACKGROUND OF THE INVENTION

Integrated circuits use output drivers to drive off-chip loads. This can involve driving capacitances of up to 100 pf (pico-farads). To quickly charge up such a load requires sourcing and sinking a large current into the load. This situation is expressed by the relationship $dv/dt=I/C$. However, because of the inductance of the bond wires and lead frame, a changing current in the output driver will produce a voltage change on the power supply ($V_{CC}$) or ground (GND) pins. This phenomena is known as $V_{CC}$ bounce and ground bounce, respectively. The induced voltage (V) on the $V_{CC}$ or GND pin is proportional to the rate of change of the current, and is given by $V=-L\, di/dt$, where L is the inductance of the bond wires and/or lead frame.

Ground bounce is a problem for at least two reasons. Because it changes the voltage seen at the output of the driver with respect to ground, and because multiple drivers typically share a common ground connection, the ground bounce from a driver switching can change the outputs of the other drivers sharing the same ground connection. This may make another integrated circuit on the same printed circuit board see an incorrect voltage level. An even bigger problem (because the voltage spike is larger on the integrated circuit side of a parasitic inductor compared to the ground side) is that multiple output drivers often have an input buffer connected to a common pad. This is done to implement bi-directional input/output operations. As a result, a voltage spike on the ground connection may make the input buffer assert an incorrect level.

Multiple output drivers switching in the same direction each contribute to the changing current. Therefore, the overall current change with time (di/dt) gets multiplied for every output driver on the same $V_{CC}$ or $V_{SS}$ connection. This suggests minimizing the induced voltage by reducing the number of output drivers sharing a common connection. However, a conflicting trade-off is that it is desirable to minimize the pin count of an integrated circuit; thus, it is desirable to share as many input/output pads as possible with a common ground or power supply pin.

Another consideration is that, for an integrated circuit to be able to drive a capacitive load fast enough at slow PVT (process-voltage-temperature), the output driver must be sufficiently large. However, for such a large output driver used at fast PVT, the di/dt will be greater, causing more ground and power supply bounce.

One method of addressing the ground and power supply bounce problem is to utilize open loop control of the output stage rate of change of Vgs (d(Vgs)/dt). This method is based on providing slew rate limiting of the voltage applied to the gates of the output stage. By limiting the rate at which Vgs changes, the rate of change of the current in the output stage is limited (since $Id=K(Vgs-Vt)^2$), This technique creates bias voltages vbias_p and vbias_such that the slew rate of the current starved inverters in the output driver is constant over PVT, and is typically implemented using a bandgap reference.

However, a disadvantage of this technique is that the "on" resistance of certain of the inverters still has some influence on the slew rate, and because voltages vbias_n and vbias_p are only subjected to open loop control, the optimal slew rate may not be realized over varying PVT. Another disadvantage is that the bias circuit requires extensive redesign when the input/output cell is ported to a new process.

Another attempted solution to the ground and power supply bounce problems is to artificially increase the resistance in series with the parasitic inductance arising from the bond wires or lead frame. This method is implemented by adding a resistor in series with the ground and $V_{CC}$ lines internal to the integrated circuit, with the resistance placed between the output driver transistors and the ground/$V_{CC}$ pads. This damps the noise (voltage) spikes caused by a rapidly changing current. A disadvantage of this approach is that it reduces the VOL/VOH margins by creating an IR voltage drop. Another disadvantage is that the damping depends on the value of R, which is only loosely controlled over various processes.

Yet another approach to the ground and power supply bounce problem is to use multiple, staggered output drivers. This method breaks the output stage into multiple stages that turn on one after another. This distributes the changing current over a greater time period, reducing the magnitude of the (di/dt) term and hence the induced voltage which causes the ground (or power supply) bounce. A disadvantage of this approach is that the staggering amount is PVT dependent. Another disadvantage is that the staggering is performed in an open loop manner.

A possible improvement to this approach is discussed in the article entitled "A Low Power-Noise Output Driver with an Adaptive Characteristic Applicable to a Wide Range of Loading Conditions", *IEEE Journal of Solid State Circuits*, Vol. 32, #6 June 1997. The article describes the use of feedback control to choose how many output stages actually get turned on. However, the granularity is only one or two stages.

What is desired is a circuit that reduces the ground and/or power supply bounce which arises from a changing current in an output driver, and which overcomes the disadvantages of the known methods.

SUMMARY OF THE INVENTION

The present invention is directed to a circuit for reducing the ground and power supply bounce of the output drivers in a group of I/O cells. A replica I/O cell is part of a delay locked loop which uses closed-loop feedback control to determine the magnitude of a bias current needed to cause the delay through the replica cell to be equal to a reference value. By forcing the delay through the replica cell to be equal to a desired reference value, the magnitude of bias current required to control the delay through each of the I/O cells in an I/O ring so that the delay approaches the reference value can be determined. As a result, by properly selecting the reference delay value, the magnitude of the bias current required to compensate for delay variations arising from multiple sources (e.g., PVT) can be determined. Since this reduces the rate of change of the current in the output drivers of the actual I/O cells, the induced voltage responsible for the ground and/or power supply bounce in those cells is reduced.

Further objects and advantages of the present invention will become apparent from the following detailed description and accompanying drawings which set forth an illustrative embodiment in which the principles of the invention are utilized.

DETAILED DESCRIPTION OF THE PREFERRED EMBODIMENT

The inventors of the present invention have recognized that a possible solution to the power supply and/or ground bounce problem(s) discussed above is to attempt to keep (di/dt) in the output stage constant over PVT and as small as possible in magnitude, but still capable of driving the off-chip load capacitance fast enough. In accordance with the present invention, this is accomplished by adjusting the bias voltages applied to the gates of the output stage transistors using a closed loop feedback scheme, causing the delay through the output stage(s) to approach that of a desired value.

Figure 1:
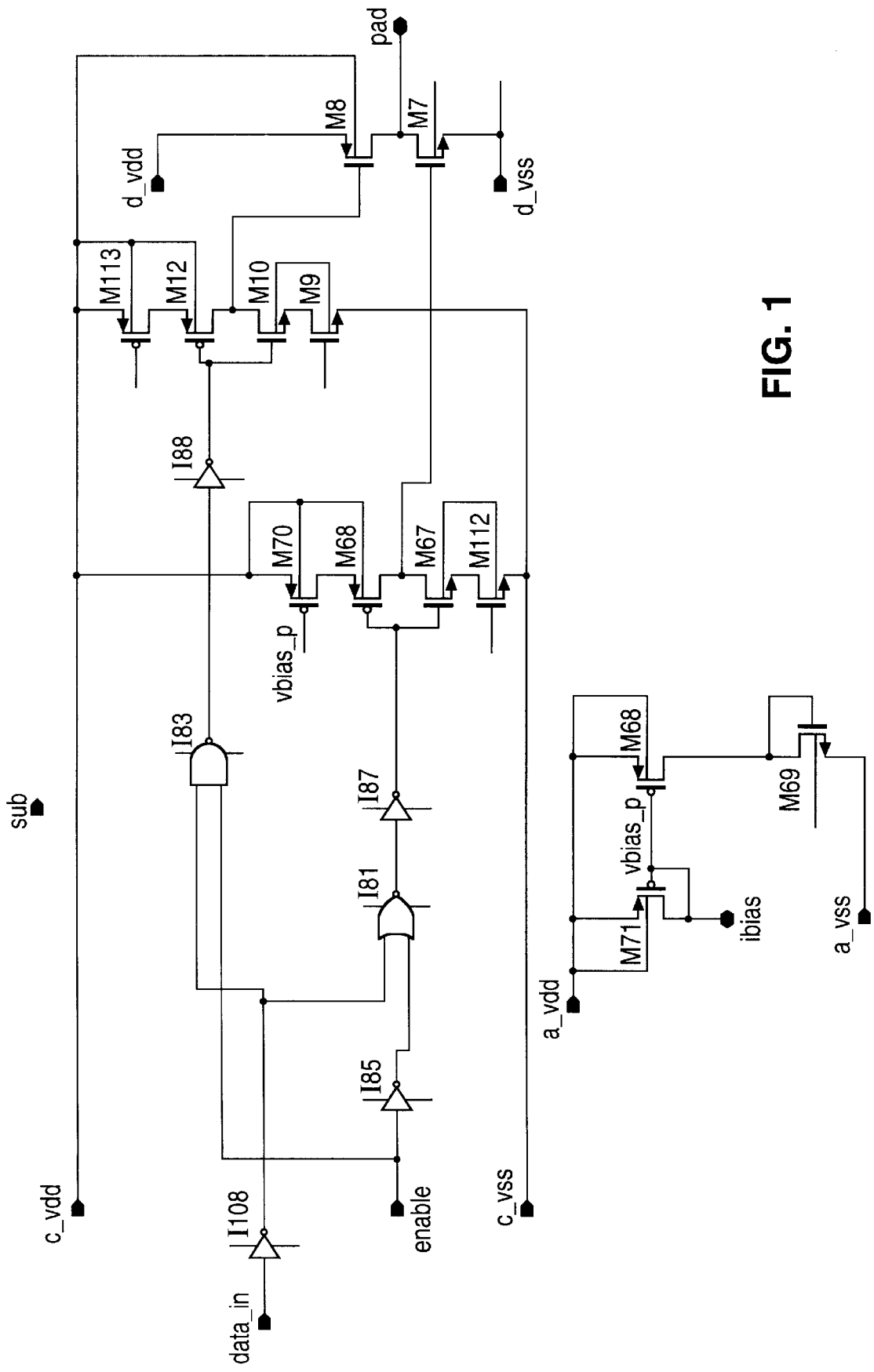
FIG. 1 is a schematic diagram illustrating an output driver stage which is part of the ground and power supply bounce control circuit of the present invention.

FIG. 1 is a schematic diagram showing an output driver stage which is part of the ground and power supply bounce control circuit of the present invention. Note that instead of a constant current, the I/O buffer is biased with a current provided by feedback from a delay locked loop (DLL).

Referring to FIG. 1, transistors M9, M10, M12, and M113 form a current starved inverter used to drive the gate of output p-channel transistor M8. Transistors M67, M68, M70, and M112 form a current starved inverter used to drive the gate of output stage n-channel transistor M7. By raising vbias_p and lowering vbias_n, the rate of change of Vgs (dVgs/dt), and hence di/dt, of the output stage may be controlled.

The present invention is a means to insure that the rise/fall time of Vgs of transistor M7 and Vgs of transistor M8 are either constant over PVT or slow down at faster PVT. This insures that di/dt of Id of transistor M7 and Id of transistor M8 remains the same over PVT during switching. This is accomplished by controlling the delay through the output stage. For example, if the maximum output edge to edge rate was 10 ns (50 mhz outputs), the ideal waveform for Id of transistor M7 and Id of transistor M8 would be a ramp that changes between $V_{CC}$ and GND in 10 ns. Furthermore, the ideal rate of change of current in transistor M12 and transistor M113 is as fast as possible, to quickly turn off transistor M8, thereby reducing simultaneous conduction through transistors M8 and M7. Therefore, transistor M113 has its gate tied to $V_{SS}$. Although turning off transistor M8 fast causes a large di/dt, it is of a polarity to cause the bounce to occur above d_vdd, and, therefore, is not a problem. Transistor M9 is biased by vbias_n, which is set by ibias. This gives a ramp on Vgs of transistor M8, which minimizes di/dt during turn-on of M8.

Using the same reasoning as described above, the ideal rate of change of current in transistors M67 and M112 is as fast as possible, to quickly turn off transistor M7, reducing simultaneous conduction through transistors M8 and M7. Therefore, transistor M112 has its gate tied to $V_{DD}$. Although turning off transistor M7 fast causes a large di/dt, it is of a polarity to cause the bounce to occur below d_vss, and, therefore, is not a problem. Transistor M70 is biased by vbias_n, which is set by ibias. This gives a ramp on Vgs of transistor M8, which minimizes di/dt during turn-on of M8.

A relatively constant slew rate for Vgs of transistor M8 falling and for Vgs of transistor M7 rising can be obtained by comparing the delay from the IN pin to the OUT pin (labelled "pad" in the figure of the output driver to a known reference delay, and adjusting vbias_n and vbias_p until the delay through the driver is equal to this reference delay. Including the output stage in the delay measurement, rather than taking the output delay from the inputs to transistors M7 and M8, creates even more negative process compensation, since the drive currents of M7 and M8 are greater at fast PVT. This means that in order to obtain the same delay at fast PVT as at slow PVT, the current ibias must be decreased at fast PVT, more so than if the delay being calibrated did not contain the output stage. In that case, most of the delay would be from the current starved inverters, and process compensation would be about zero, still much better than positive, but not as good as negative. Here, zero process compensation means that the rise/fall times are independent of PVT, while negative process compensation means rise/fall times increase with faster PVT, and positive process compensation means that rise/fall times decrease with faster PVT.

The inventors of the present invention have recognized that a delay locked loop (DLL) can provide the necessary feedback to set ibias in a manner which maintains an approximately constant input to output delay. To avoid requiring a DLL for each I/O driver, a replica of the driver is used in conjunction with a DLL to determine the correct vbias_p and vbias_n voltages.

The replica I/O driver is an element of a delay locked loop which forces the data-in to pad delay of a dedicated I/O cell (i.e., the replica I/O driver) to be equal to an exact time interval, which can be synthesized using another DLL. The replica I/O cell has an adjustable load, either an off-chip capacitor or on-chip capacitor. The calibration loop which includes the replica I/O driver and DLL logic acts to compare the delay from data-in to pad (output) for the replica with a desired time delay, and force the two delays to become equal.

As discussed below, a component of the total delay through the replica I/O cell is determined by the magnitude of ibias applied to the gates of the output stage transistors. Thus, by forcing the delay through the replica cell to be equal to a desired reference value, the magnitude of ibias required to control the delay through each of the I/O cells in an I/O ring so that the delay approaches the reference value can be determined. As a result, by properly selecting the reference delay value, the magnitude of ibias required to compensate for delay variations arising from multiple sources (e.g., PVT) can be determined.

The total delay through an I/O cell can be broken down into two parts; a first part which is adjustable by ibias (the delay of the current starved inverters driving the gate capacitance of transistors M7 and M8), and a second part that depends on PVT (the delay through gates I85, I81, I87, and I83, and the delay from the output stage driving the load). The PVT dependent delay will typically vary by a factor of 3 over PVT. To keep the total delay through the I/O cell equal to the reference delay requires supplying a higher ibias at slow PVT, and lower ibias at fast PVT. Since ibias controls the slew rate of the current starved inverters, which in turn controls the di/dt in the output stage, the result is the desired situation of less di/dt at fast than at slow PVT (recall that the ground/$V_{CC}$ bounce is a function of di/dt). By forcing the delay through the I/O buffer to be constant over PVT, the ground/$V_{CC}$ bounce is reduced at fast PVT, keeping it about equal to that at slow PVT.

Referring to FIG. 1, if ibias is too high, the fall time of the current starved inverter charging the gate capacitance of transistor M8 will be too fast, and the rise time of the current starved inverter charging the gate capacitance of transistor M7 will be too fast. This can be detected by the propagate delay from data_in to pad in the I/O driver. If ibias is too low, the fall time of the current starved inverter charging the gate capacitance of transistor M8 will be too slow, and the rise time of the current starved inverter charging the gate capacitance of transistor M7 will be too slow.

Figure 2:
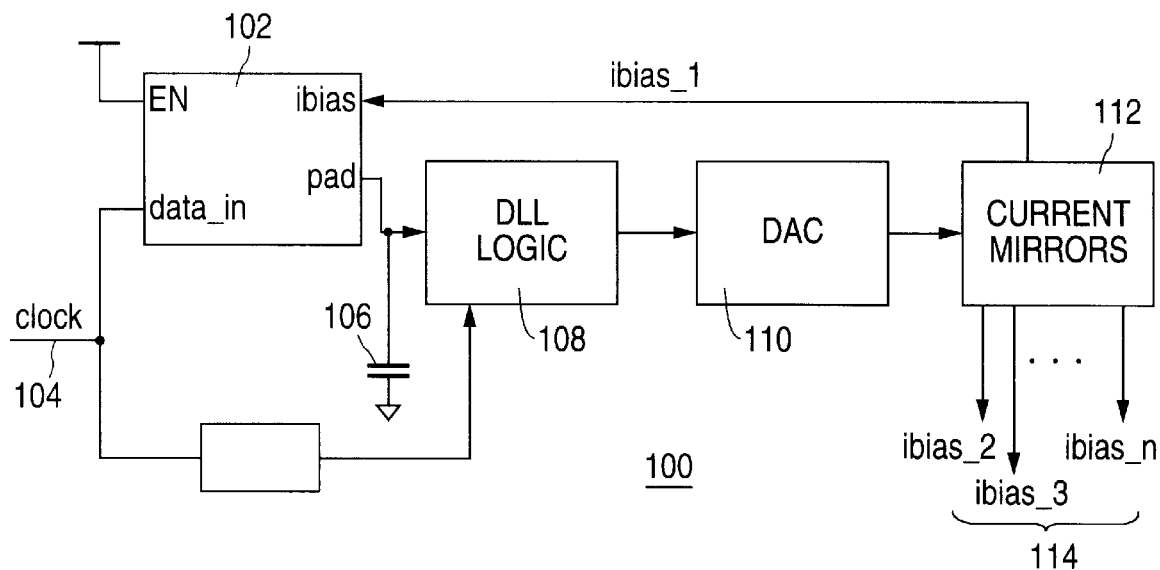
FIG. 2 is a block diagram illustrating the ground and power supply bounce control circuit of the present invention as used to control the bounce of a group of I/O cells.
Figure 2:
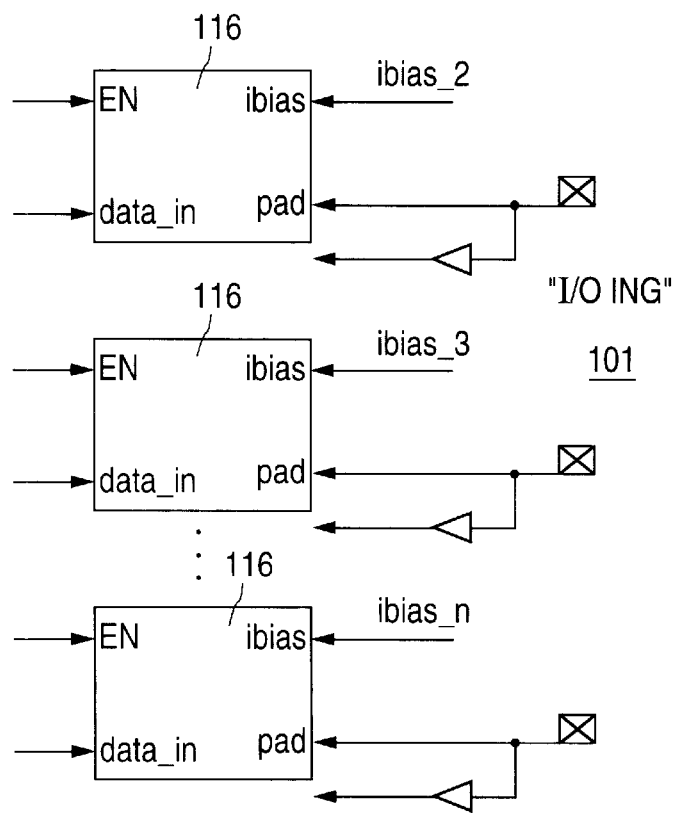

FIG. 2 is a block diagram showing the ground and power supply bounce control circuit 100 of the present invention as used to control the bounce of a group of I/O cells (labelled an "I/O Ring 101"). As shown in FIG. 2, replica I/O cell 102 is used to delay a test signal ("clock") 104 loaded by an on or off chip capacitor 106. Capacitor 106 can be set to the minimum capacitance expected on the PCB, or about 10 pf. Signal "clock" 104 is also delayed by a precision delay equal to the desired delay through replica I/O cell 102. The rising edges of the output of replica cell 102 and the precision delay signal are compared in DLL logic 108. A description of an embodiment of DLL logic suitable for use in conjunction with the present invention may be found in the U.S. Patent Application entitled "DLL Based Clock Synthesis", Attorney Docket No. NSCI-D0500, filed the same day as this application; and the contents of Application Attorney Docket No. NSCI-D0500 is hereby incorporated by reference in its entirety.

DLL logic 108 will create an 8 bit control word to current digital-to-analog converter (DAC) 110. Current DAC 110 will create a current, labelled "ibias-1" in FIG. 2, that will adjust the delay of the current starved inverters in replica I/O cell 102 such that the total delay matches the precision reference delay. This current is mirrored using current mirror(s) 112 to generate a set of bias currents 114 (labelled "ibias-2, ibias-3, ibias-n") which are provided as control currents to each of the actual I/O cells 116 n I/O ring 101. Although the actual I/O cells will have different loads (e.g., more capacitance than the replica) and will, therefore, have a delay through the cells not exactly equal to that of the replica I/O cell, the rate of change of voltage at the input to transistors M7 and M8 (the output stage) for the replica and actual I/O drivers will be identical. Therefore, the di/dt in the respective output stages will be the same. This will control the ground and $V_{CC}$ bounce of the actual cells.

A feature of the present invention is that the amount of PVT compensation can be adjusted by two methods, allowing for trade-off between I/O latency and ground bounce magnitude. One method of compensation is to add more delay into the calibrator. For example, rather than locking just the I/O cell delay to the precision reference delay, a string of buffers that change in delay by a factor of 3X over PVT could be added to the I/O delay. This causes the current starved inverters to create an even slower slew rate at fast PVT to keep the DLL in lock, reducing di/dt in the output stage even more. A digital multiplexer could be used to select either no extra delay, or increments of additional delay. Another method of tuning performance of the invention is to make the reference delay adjustable; by making this smaller, the buffer is sped up at the cost of increased ground bounce.

An additional feature of the present invention is that if the replica load is chosen to be close to the actual load, the result is an I/O cell having a delay which does not depend on PVT. This is an advantage for high signaling rates in that the setup/hold margins in a timing budget are reduced by PVT variation in the I/O cells. Note that another advantage is that the DLL used in the present invention is small (<100 sq mils at 0.35 um) and is very process portable.

Figure 3:
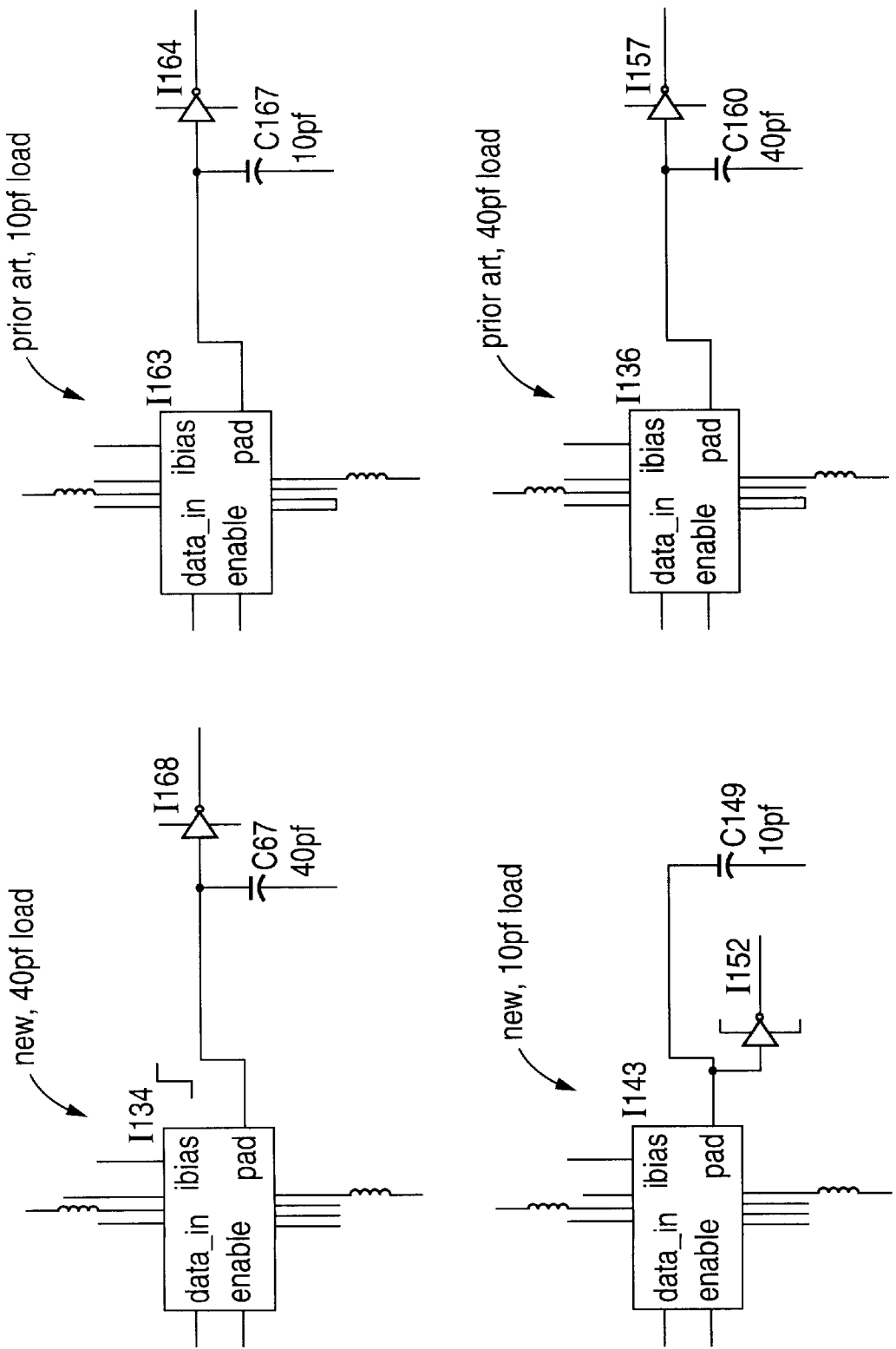
FIG. 3 shows the test set-up for simulations of the present invention with a 40 pf load and a 10 pf load, and for the same I/O cell with open loop control for the same loads.

The inventors have conducted a set of simulations designed to demonstrate the ground/power supply bounce reduction benefits of the invention. FIG. 3 shows the test set-up for simulations of the present invention with a 40 pf load and a 10 pf load, and for the same I/O cell with open loop control for the same loads. The present invention was simulated using an 8 nH parasitic inductance. Two corners were examined; SLOW, 150C, 2.7V and FAST, 0C, 3.6V, and two load conditions, 10 pf and 40 pf. As a comparison, a constant current biasing the current starved inverters was used. Because such a current is only controllable to within 10%, a current was chosen that would match the DLL calibrated I/O delay at slow PVT, and was also used at fast PVT. The simulation results suggest that the present invention gives a 50% improvement in ground/$V_{CC}$ bounce, which could allow sharing of 50% more I/O's on a single $V_{CC}$/GND pair. The following table summarizes a comparison of this approach and prior art.

| Condition | Replica I/O Delay | Actual I/O Delay | Art I/O Delay | New GND Bounce | New $V_{cc}$ Bounce | Art GND Bounce | Art $V_{cc}$ Bounce | Ibias |
|---|---|---|---|---|---|---|---|---|
| 40 pf 2.7 V SLOW 150C | 3.34n | 4.7n | 4.7n | 70mV | 95mV | 70mV | 95mV | 27 μA |
| 10 pf 2.7 V SLOW 150C | 3.34n | 3.1n | 3.1n | 68mV | 85mV | 68mV | 85mV | 27 μA |
| 40 pf 3.6 V FAST 0C | 3.34n | 4.86n | 3.67n | 106mV | 130mV | 160mV | 200mV | 18 μA |
| 10 pf 3.8 V FAST 0C | 3.34n | 3.31n | 2.47n | 140mV | 100mV | 180mV | 180mV | 18 μA |

The "Replica I/O Delay" data gives the delay through the replica I/O driver, which will be exactly 3.34 ns in this simulation. This is because the DLL will force delay to be this amount. The "Actual I/O Delay" data is the delay through the I/O cell with the load as indicated under the column titled "Condition". The "Art I/O Delay" data is the delay through an I/O cell operating under open loop control under these conditions. "New GND Bounce" data is the peak ground bounce of the present invention for the indicated condition. The "Art Ground Bounce" is the peak ground bounce of the I/O cell operating under open loop control. Similarly, the "New $V_{CC}$ Bounce" data and "Art Vcc Bounce" data are the peak power supply bounce of the present invention and open loop control circuit, respectively, for the indicated condition. The "Ibias" data is the current fed back by the DLL to bias the current starved inverter. For the open loop control circuit, a current of 27 uA was used at both fast and slow PVT. This is optimistic, in that the constant current would need to be targeted 5% higher to cover the variation of this current over PVT. That is why the results are identical for the present invention and open loop circuit at slow PVT; it is the DLL provided feedback that reduces this current at fast PVT.

Figure 4:
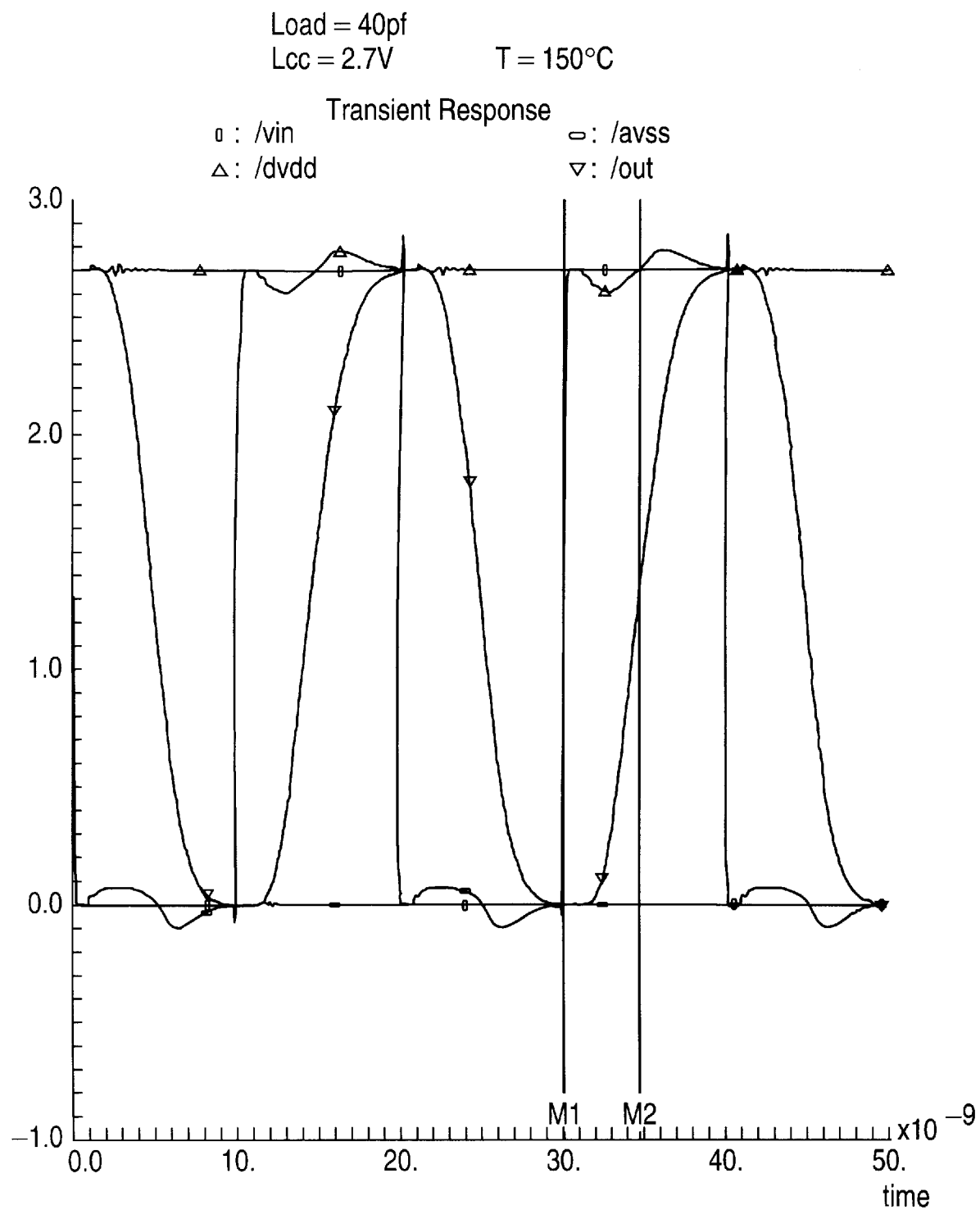
FIGS. 4–11 are graphs showing the results of the simulations of the performance of the present invention as compared to that of an I/O cell with open loop control.
Figure 5:
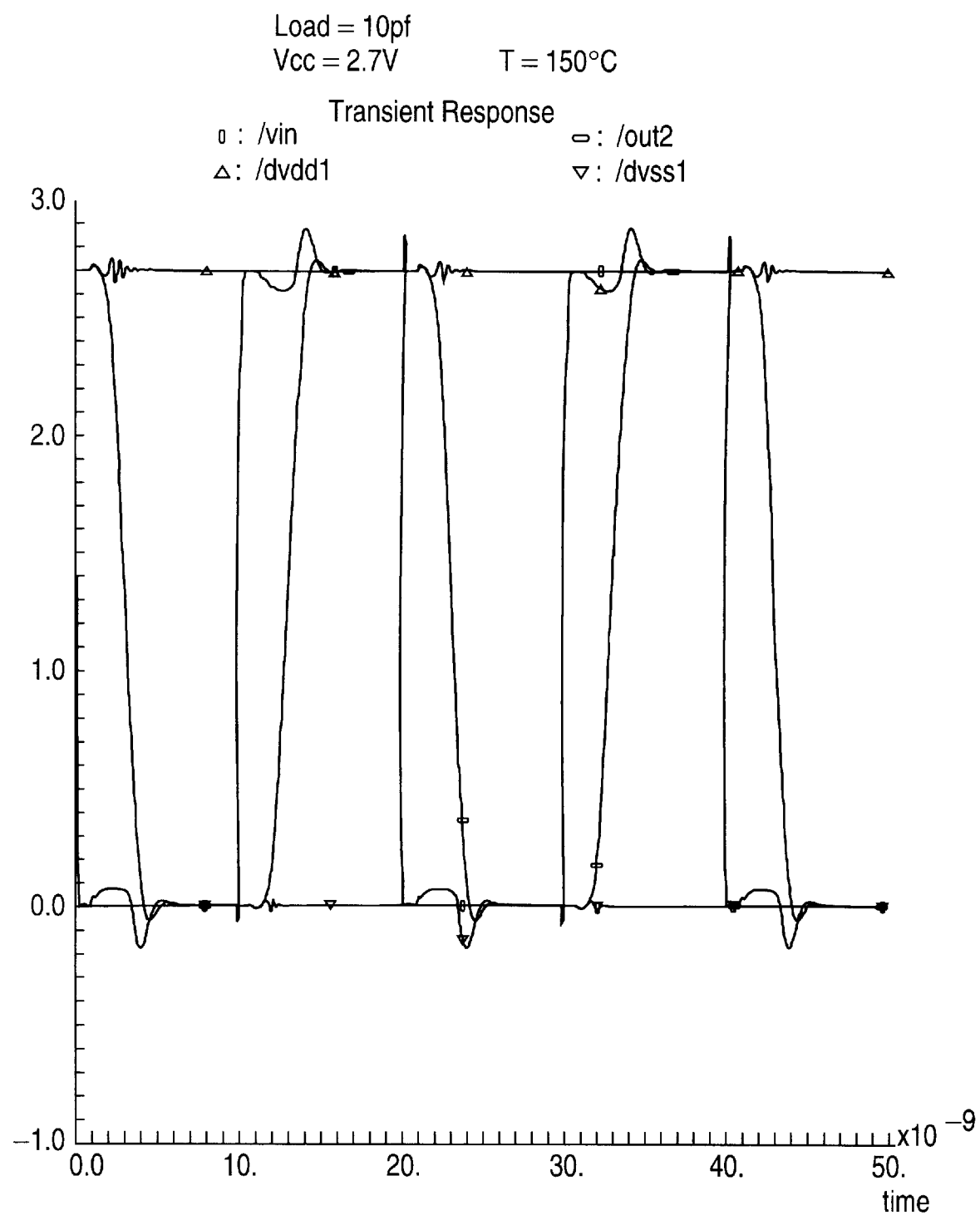
Figure 6:
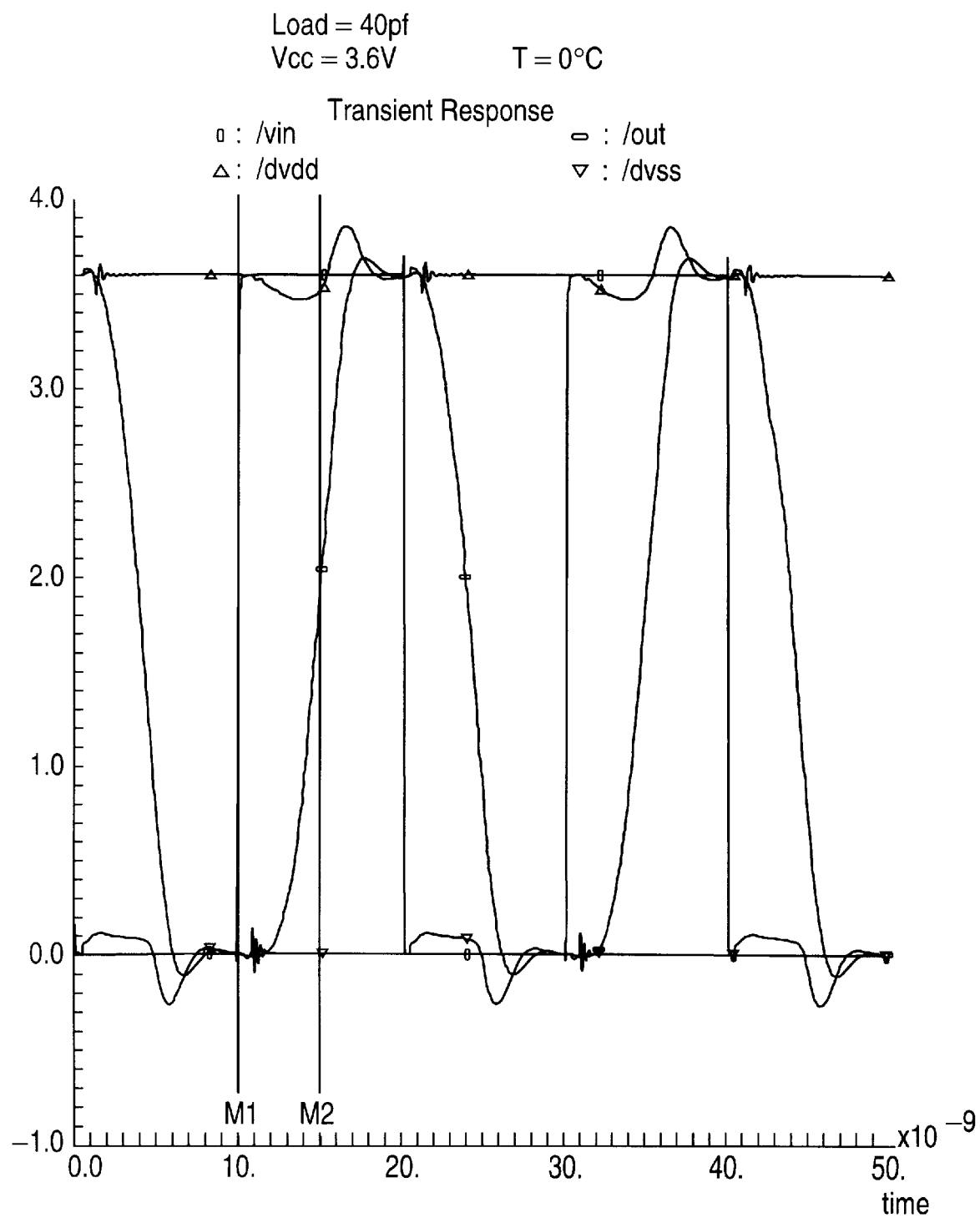
Figure 7:
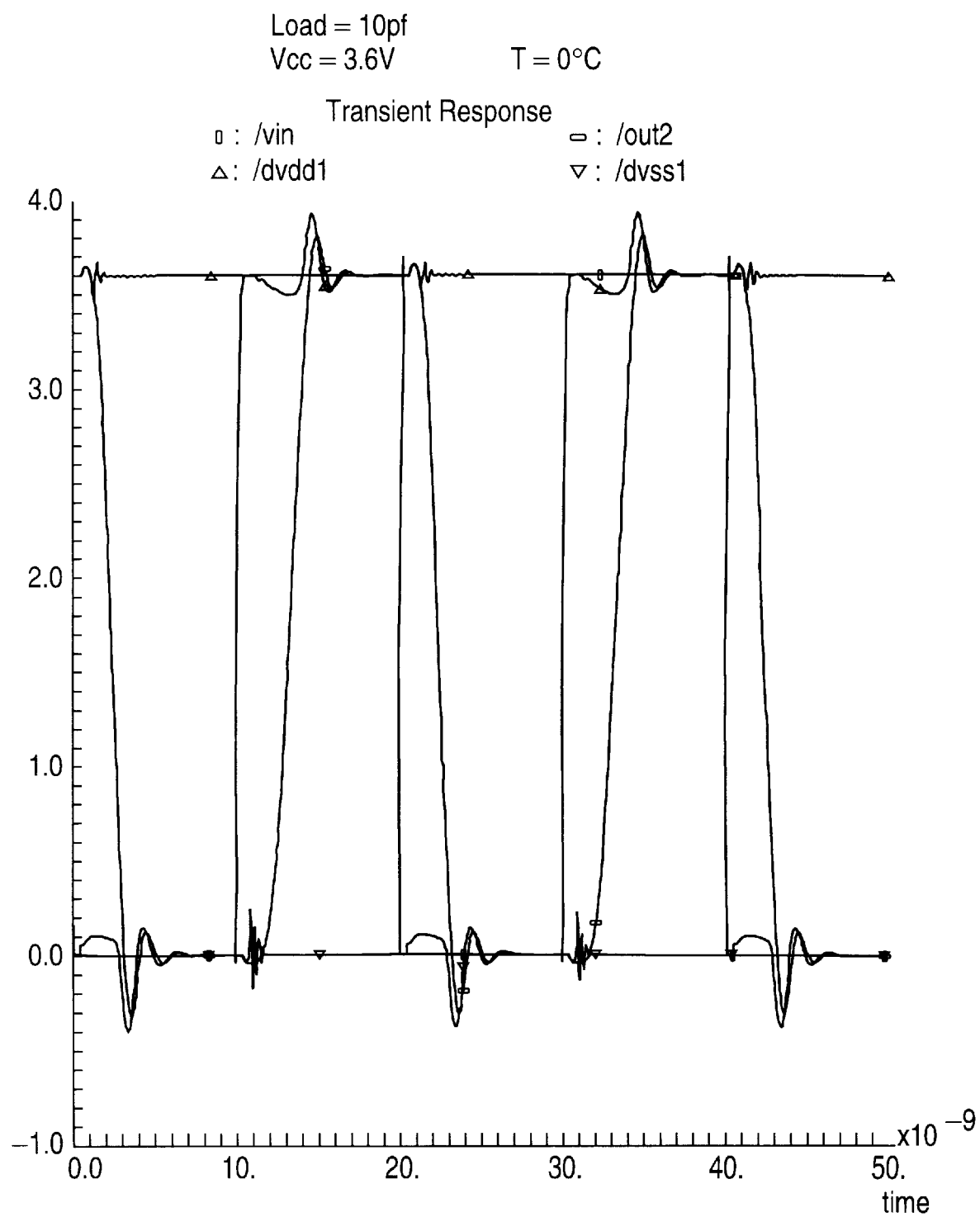
Figure 8:
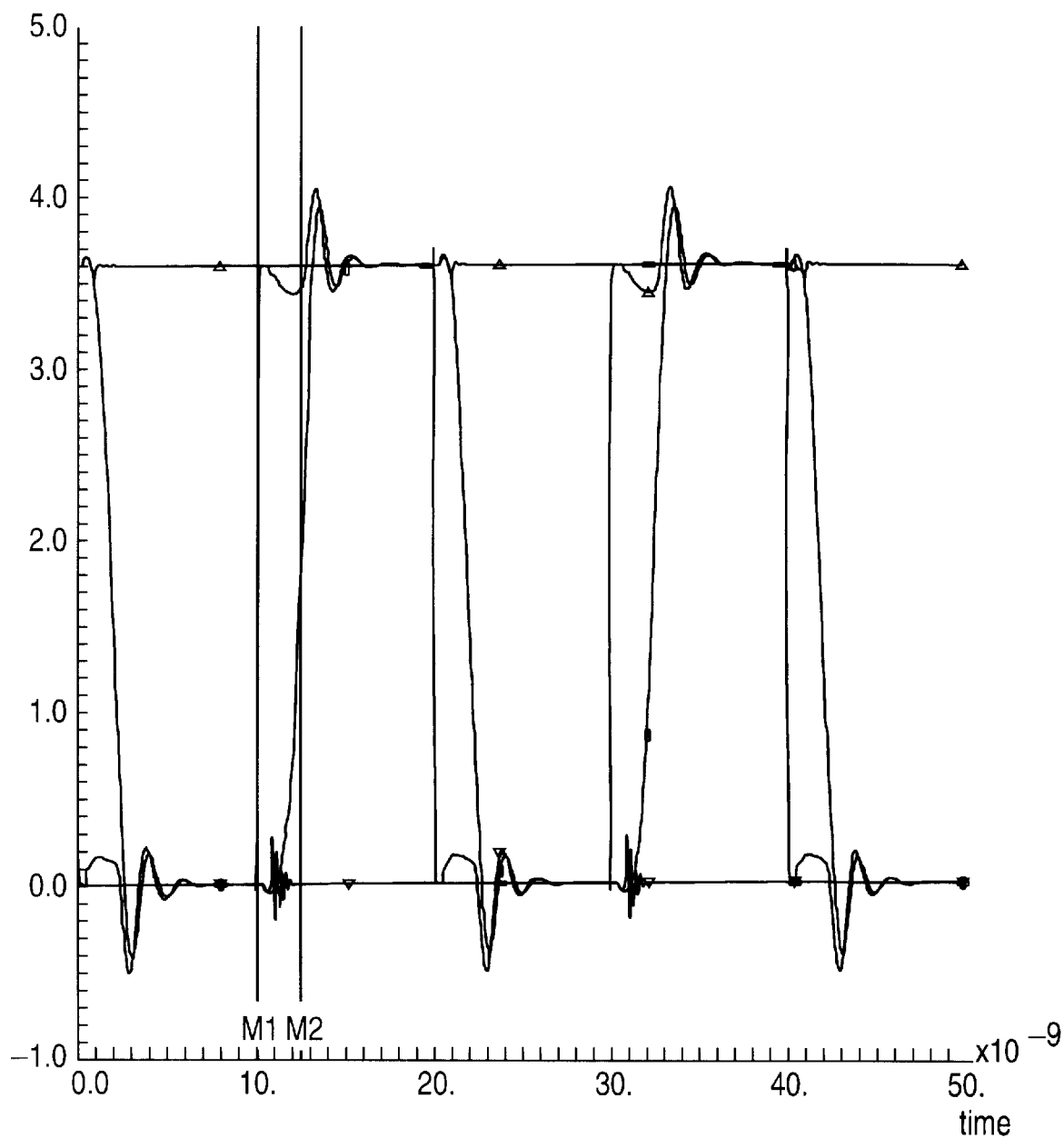
Figure 9:
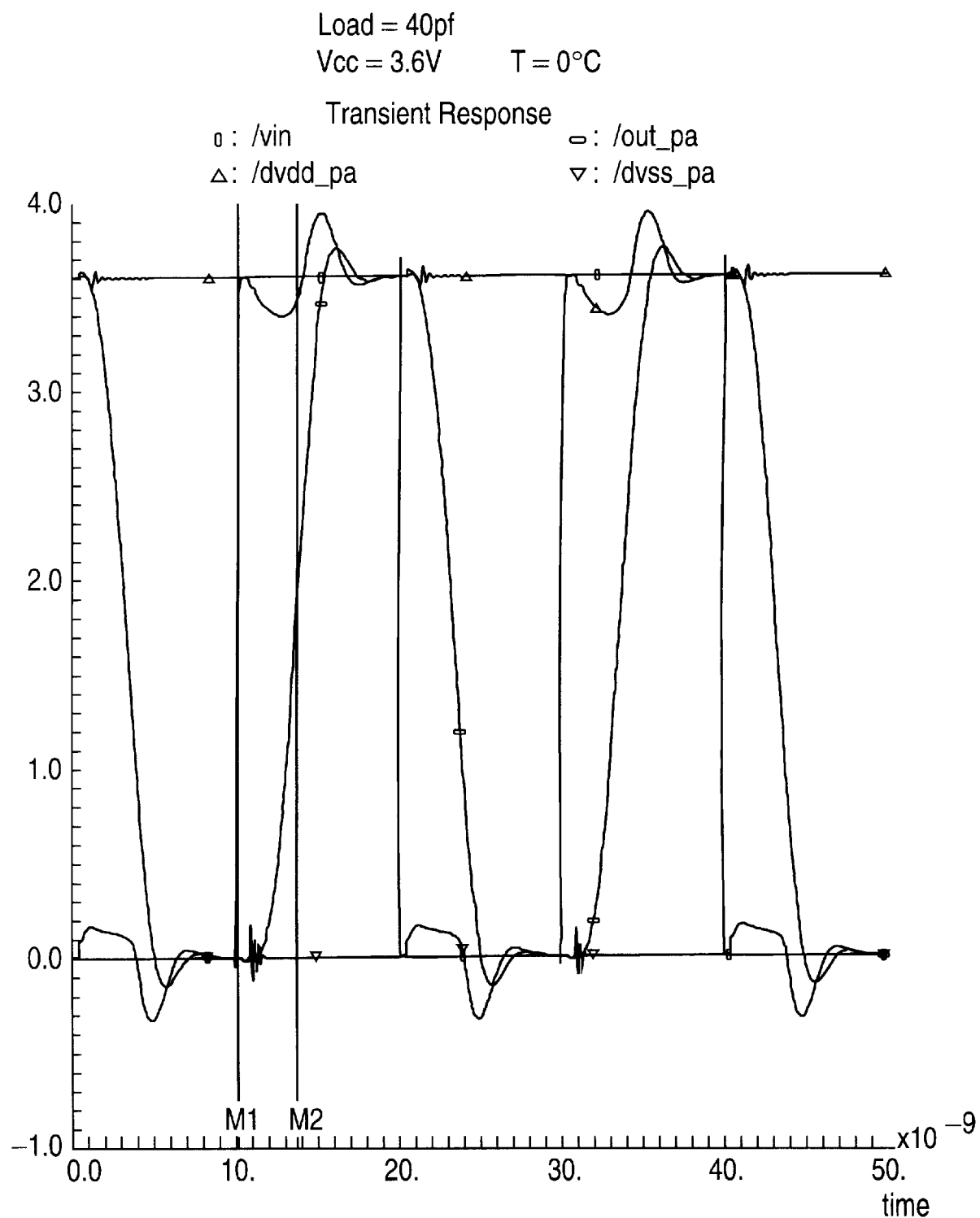
Figure 10:
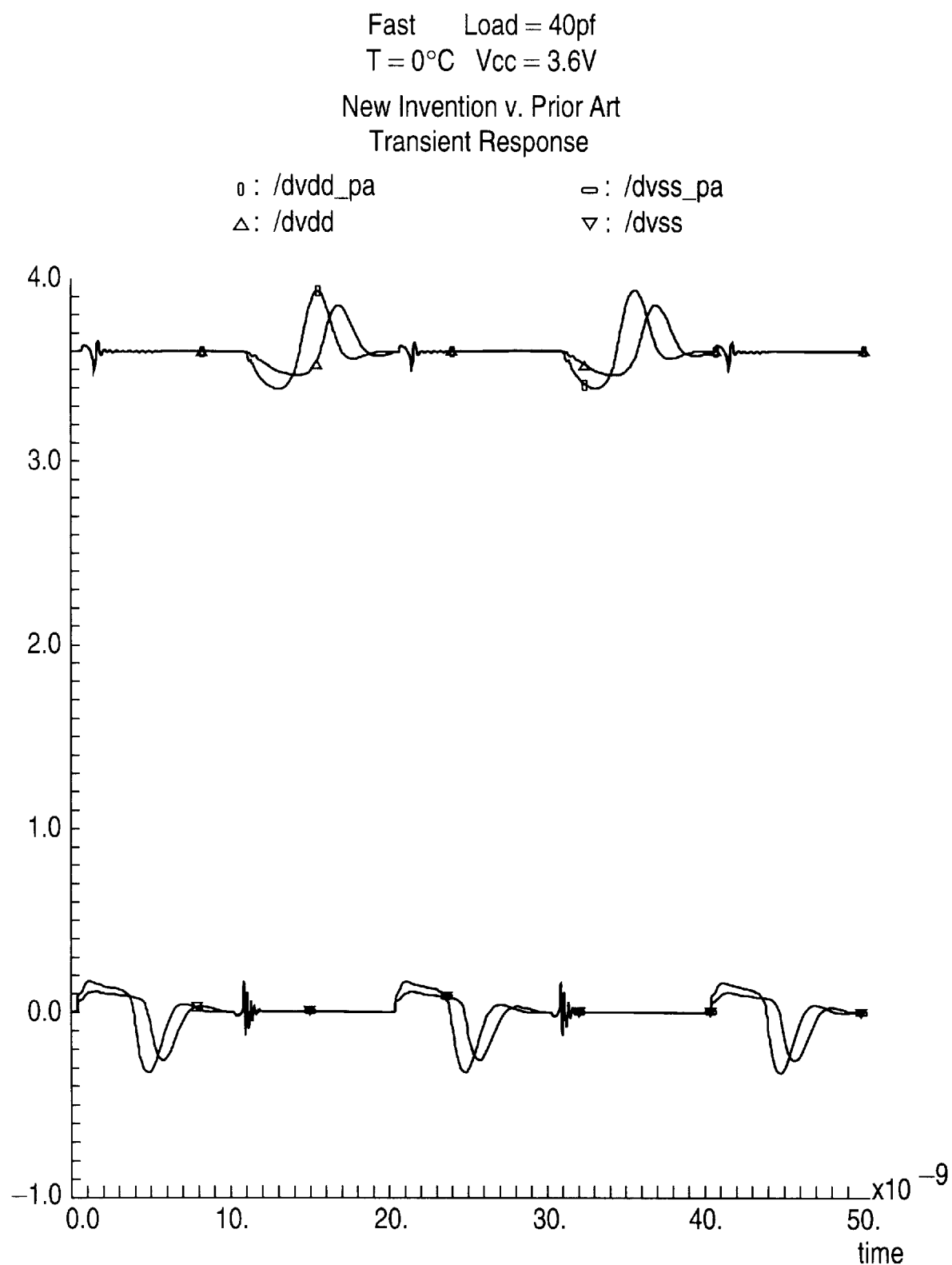
Figure 11:
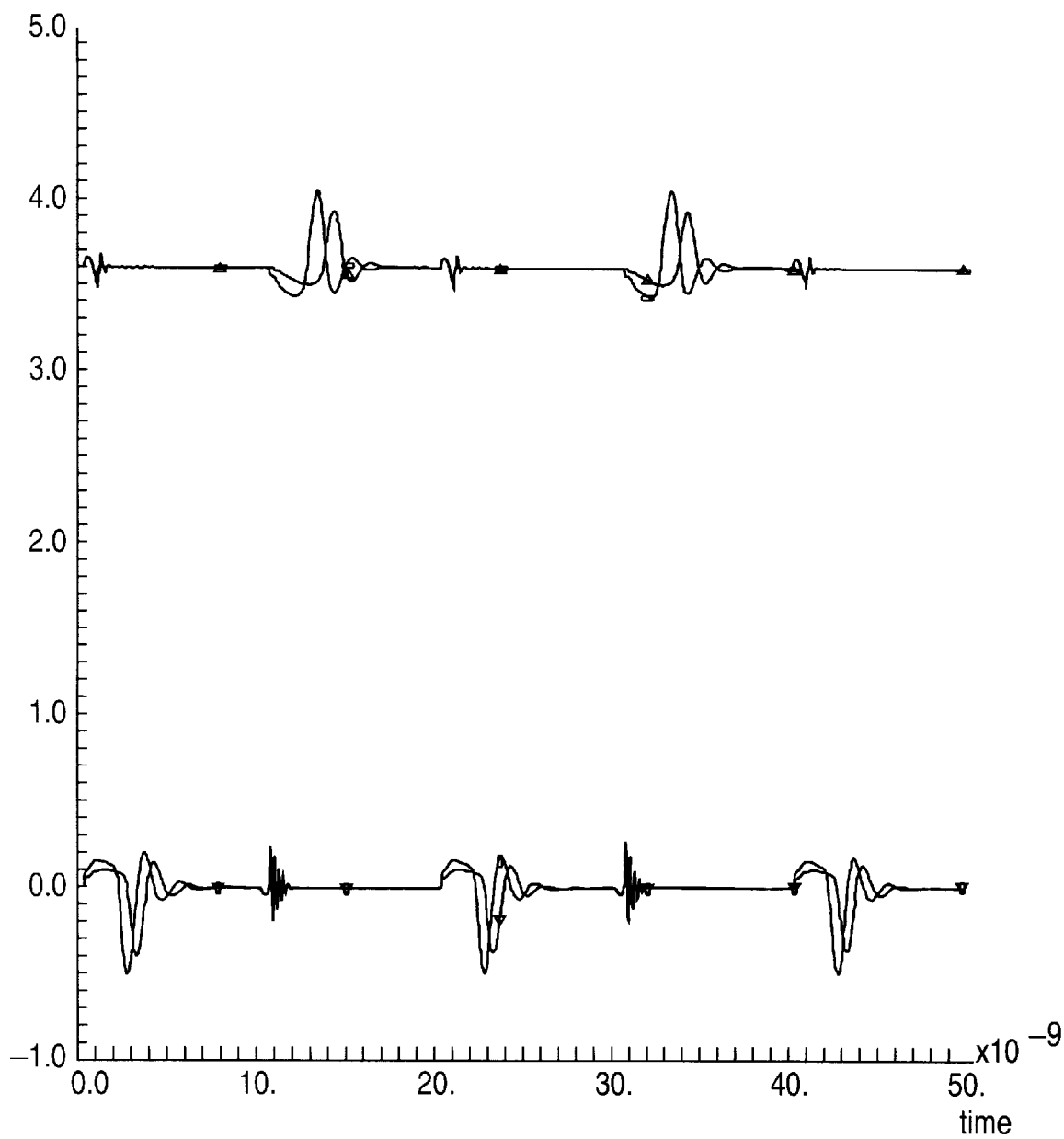

FIGS. 4–11 are graphs showing the results of the simulations of the performance of the present invention as compared to that of an I/O cell with open loop control. FIG. 4 shows both the open loop control and present invention simulation results at slow PVT with 40 pf load. Since ibias is the same, the waveforms overlap. FIG. 5 shows both the open loop control and present invention results at slow PVT with 10 pf load. FIG. 6 shows simulation results for the present invention at fast PVT and 40 pf load. FIG. 7 shows simulation results for the present invention at fast PVT and 10 pf load figure. FIG. 8 shows simulation results for the open loop control circuit at fast PVT and 40 pf load. FIG. 9 shows simulation results for the open loop control circuit at fast PVT and 10 pf load. FIG. 10 shows DGND and DVDD for the open loop control circuit versus the invention at fast PVT, 40 pf load. FIG. 11 shows DGND and DVDD for the open loop control circuit versus the invention at fast PVT, 10 pf load.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

What is claimed is:

1. A ground bounce control circuit for reducing ground and/or power supply bounce in an integrated circuit wherein a plurality of output drivers, each of said output drivers being associated with a corresponding I/O cell included in the integrated circuit are connected to an output pad of the integrated circuit, the ground bounce control circuit comprising:

a replica I/O cell that delays a test signal clock by a desired delay amount based upon a bias signal provided to the replica I/O cell;

a precision delay control that delays the test signal clock by a precision delay amount;

a delay locked loop (DLL) that compares the desired delay amount and the precision delay amount and generates a digital control signal that corresponds to a difference between the desired delay amount and the precision delay amount;

a digital-to-analog converter that converts the digital control signal to the bias signal provided to the replica I/O cell; and a current mirror circuit that responds to the bias signal by generating a plurality of bias current signals, each of said bias current signals being provided to a corresponding one of the I/O cells of the integrated circuit to control the delay through said corresponding I/O cell.

2. A ground bounce control circuit as in claim 1, and wherein the delay lock loop utilizes closed loop feedback to determine a magnitude of the bias signal needed to cause the delay through the replica I/O cell to be equal to the precision delay amount.

* * * * *